(12) United States Patent
Becker et al.

(10) Patent No.: US 6,190,997 B1
(45) Date of Patent: Feb. 20, 2001

(54) DEVICE FOR MECHANICALLY ALIGNING A CARRIER SUBSTRATE FOR ELECTRONIC CIRCUITS

(75) Inventors: Klaus Becker, Gomaringen; Eugen Armbruster, Pliezhausen, both of (DE)

(73) Assignee: Robert Bosch GmbH, Stuttgart (DE)

( * ) Notice: Under 35 U.S.C. 154(b), the term of this patent shall be extended for 0 days.

(21) Appl. No.: 09/346,570

(22) Filed: Jul. 1, 1999

(30) Foreign Application Priority Data

Jul. 2, 1998 (DE) ............................................. 198 29 580

(51) Int. Cl.[7] ........................ H01L 21/76; H01L 21/44; B23P 19/00; B23Q 1/25
(52) U.S. Cl. ......................... 438/401; 438/106; 438/800; 29/830; 29/759; 29/240; 29/241; 269/42; 269/71; 269/160; 269/903
(58) Field of Search ................................. 438/401, 800, 438/975, 106; 29/939, 830, 740, 759, 760, 240, 241, 281.1, 271; 269/41–45, 152, 58, 37, 903, 50, 57, 139, 160, 71

(56) References Cited

U.S. PATENT DOCUMENTS

| | | | |
|---|---|---|---|
| 3,849,857 | * | 11/1974 | Murray et al. ........................ 29/200 |
| 4,784,377 | * | 11/1988 | Woodward ............................ 269/71 |
| 4,821,393 | * | 4/1989 | Spigarelli ............................. 29/759 |
| 4,898,268 | * | 2/1990 | Kamioka et al. ..................... 29/759 |
| 4,998,712 | * | 3/1991 | Park et al. ............................ 269/71 |
| 5,218,753 | * | 6/1993 | Suzuki et al. ........................ 29/760 |
| 5,858,689 | * | 12/1998 | Mogi et al. .......................... 29/759 |

FOREIGN PATENT DOCUMENTS 24 40 088   3/1975   (DE) .

* cited by examiner

*Primary Examiner*—Michael Trinh
(74) *Attorney, Agent, or Firm*—Kenyon & Kenyon

(57) ABSTRACT

To avoid damage to carrier substrates in a device for mechanically aligning carrier substrates for electronic circuits, the carrier substrates having two main surfaces and a peripheral surface and being supplied to a horizontal fixture of the device, centering elements being forced to engage on the peripheral surface of the carrier substrates to align the carrier substrates in the horizontal fixture, it is proposed that at least two centering elements be mounted rotationally and displaceably in the axial direction on at least two first shafts that are oriented in parallel with one another and in parallel with the horizontal fixture. The centering elements engage on sections of the peripheral surface of the carrier substrate disposed opposite one another in a first direction, and at least two further centering elements engage with stop faces at sections of the peripheral surface of the carrier substrate disposed opposite one another in a second direction running perpendicularly to the first direction. The stop faces are movably supported in a direction perpendicular to the horizontal fixture.

10 Claims, 2 Drawing Sheets

DEVICE FOR MECHANICALLY ALIGNING A CARRIER SUBSTRATE FOR ELECTRONIC CIRCUITS

FIELD OF THE INVENTION

The present invention relates to a device for mechanically aligning a carrier substrate for electronic circuits.

BACKGROUND INFORMATION

In the processing of carrier substrates for electronic circuits, such as printed-circuit boards or ceramic substrates, the carrier substrates are aligned in the individual processing stations with respect to a predetermined position. To affix, for example, printed circuit traces or components to the carrier substrates at the positions intended for this, the carrier substrates are mechanically aligned in the fixture of a screen-printing station for imprinting circuit traces or in the fixture of an inserter (automatic component-insertion machine) for affixing electrical and/or electronic components. To this end, it is generally known to use devices for aligning a carrier substrate, which have several centering elements which engage on the peripheral surface of the carrier substrate, shifting the carrier substrate into the desired processing position. The centering elements can be adjusted in the device relative to the carrier substrate by an adjusting device and can be made to engage on the peripheral area of the carrier substrate in a spring-biased manner. By pressing the centering elements against the peripheral surface of the carrier substrate using elastic tensional force, the carrier substrates, whose size varies within a certain range of tolerance, are prevented from being damaged already at the time of engagement of the centering elements.

It must be regarded as disadvantageous in these known devices that when working with relatively brittle carrier substrates, such as ceramic multilayer substrates and, in particular, LTCC substrates, the substrate edges often break off in a muscle-shell shape at places where the centering elements engage, and that sometimes the carrier substrates break into pieces. This is due to the fact that the friction between the stop faces of the centering elements and the peripheral surface of the carrier substrate is quite substantial, and that the centering elements are not movable along the peripheral surface of the carrier substrate, but are only able to be moved towards and away from the peripheral surface. Therefore, a jamming of the carrier substrate between the centering elements cannot be ruled out. As a result, during processing, a short jerky movement produced, for example, by negative pressure applied to the bottom side of the carrier substrate or by the compressive force of an SMD inserter (component-insertion machine) can lead to breakage of the brittle carrier substrate. A further disadvantage is that the rubbing of the carrier substrate at the stop faces of the centering elements leads to premature wear and tear of the centering elements, which can result, in turn, in an imprecise alignment of the carrier substrates, as well as in break edges at the peripheral surface of the carrier substrates.

SUMMARY OF THE INVENTION

The device according to the present invention, which is used to align a carrier substrate for electronic circuits, avoids the disadvantages encountered in the related art. The device according to the present invention advantageously prevents the stop face of the centering elements from rubbing along the peripheral surface of the carrier substrate, for example, when the centering elements shift the carrier substrate into the predetermined position, or when the carrier substrate moves perpendicularly to the horizontal fixture. This advantageously prevents brittle carrier substrates from breaking off in muscle-shell shapes or in pieces. Since in the stations where carrier substrates are processed, forces are generally applied orthogonally to the main surfaces of the carrier substrate, it is a significant advantage that the special arrangement of the centering elements allows all centering elements engaging on the peripheral surface of the carrier substrate to perform a compensating movement by rotating or shifting in this direction, without any mechanical stresses being produced in the carrier substrate. A further benefit is that the mobility of the centering elements engaging on the carrier substrate prevents the centering elements from being subject to any premature wear caused by friction, thereby prolonging the service life of the device.

It is advantageous if the at least two further centering elements are supported on at least two second shafts (spindles) in a manner allowing rotation and axial displacement, the shafts running parallel to each other and perpendicularly to the horizontal fixture. This not only permits the stop faces of these centering elements to move orthogonally to the horizontal fixture of the carrier substrates, but also permits the centering elements to engage optimally on the opposing sections of the peripheral surface of the carrier substrate by executing a rotary motion about the second shafts, even if these sections are not completely plane, which is often true of ceramic LTCC substrates.

It is beneficial for the first shafts to be mounted on their respective adjusting device in a plane beneath a plane defined by the horizontal fixture, for at least one stop element to be arranged on each adjusting device, and for the centering element to be pressed against a stop face of the stop element by the centering element supported on the respective first shaft engaging on the peripheral surface of the carrier substrate. In this manner, the centering elements, movably supported on the first shafts, are not able to rotate upon making contact with the peripheral surface of the carrier substrate; however, the centering elements are still able to rotate in the opposite direction, in the case that the carrier substrate moves toward the fixture. Friction between the centering element in question and the stop face of the stop element in response to a displacement of the centering element on the first shaft can be advantageously avoided by having the stop face of the at least one stop element be movably supported in the second direction. This is easily achieved by forming at least one stop element as a cylindrical roller that is mounted on the respective adjusting device so as to permit rotation about a shaft running perpendicularly to the fixture, the stop face being formed by the lateral surface of the cylindrical roller.

It is also beneficial that the centering elements, which engage on the peripheral surface of a carrier substrate, be mounted on the respective shaft in a manner allowing rotation against the tensional force of a spring element and displacement against the tensional force of a spring element. The advantageous result is that when the carrier substrate is removed from the fixture of the device, the tensional force of the springs moves the centering elements into a defined original position or neutral position, where the centering elements are ready to receive a new carrier substrate.

A further benefit is derived when the centering elements have a plane stop face which engages on the peripheral surface of the carrier substrate. Since ceramic substrates used for electronic circuits generally have the form of a thin rectangular board, the centering elements having the plane stop faces are able to engage securely on the end faces of the ceramic substrates forming the peripheral surface.

It is advantageous for a ball bearing to be used to mount the centering elements on shafts in each case, so as to allow rotation and displacement, and thereby prolong the service life of the device.

Furthermore, it is advantageous if the centering elements of the device are forced to engage successively with the peripheral surface of a carrier substrate in such a way that one of the at least two other centering elements, whose stop faces are movably supported substantially perpendicularly to the horizontal fixture, last engages on the peripheral surface. This ensures that the carrier substrate is not jammed in between the other centering elements which are not able to move in the horizontal direction prior to the engagement of the centering elements which can be moved in the horizontal direction.

DETAILED DESCRIPTION

Carrier substrates for electronic circuits, such as ceramic multilayer substrates or LTCC substrates are provided with electronic circuit elements in special processing stations which are known per se. Such processing stations are, for example, screen-printing stations for imprinting circuit traces on the carrier substrates, SMD inserters for affixing surface-mounted devices to the main surfaces of the carrier substrates, solder-paste printing stations for applying solder paste or cementing stations for applying adhesive material for the surface-mounted devices. All these known processing stations, of which only a few are mentioned here, require that the carrier substrate be aligned for the following processing, so that the electrical and electronic components and printed-circuit traces can be accurately affixed to the carrier substrates.

Figure 1:
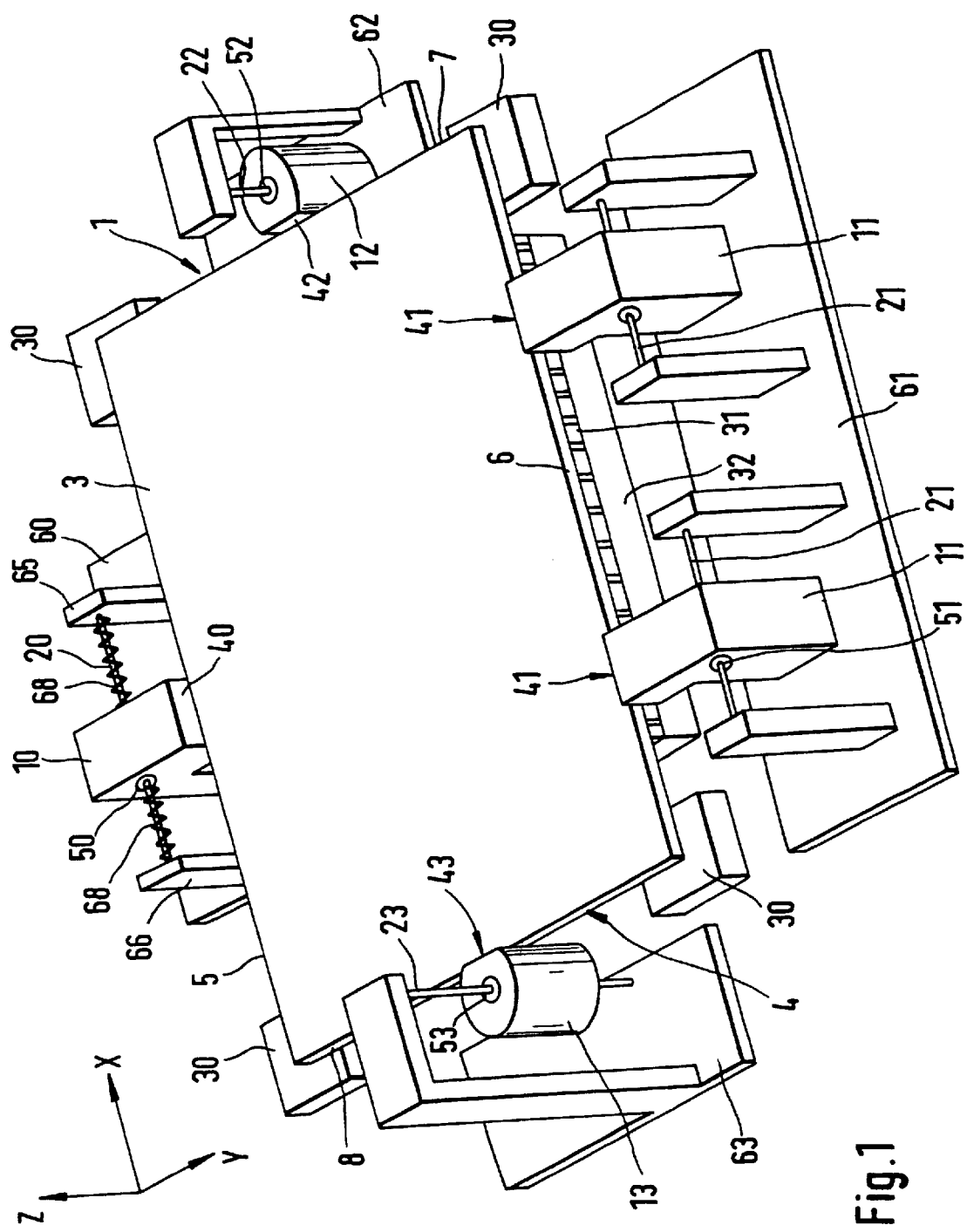
FIG. 1 shows a perspective and schematic view of a device for aligning carrier substrates according to the present invention.

FIG. 1 shows a first exemplary embodiment of a device for aligning a carrier substrate, which can be installed in a processing station for carrier substrates, for example, in a screen-printing station for LTCC ceramics. Such parts of the device, which are not necessarily required for understanding the present invention, are not shown for the sake of simplicity. As FIG. 1 reveals, the device encompasses a horizontal fixture 30, 31 for a carrier substrate 1 supplied to the screen-printing station for processing. Fixture 30, 31 encompasses four supporting surfaces 30 disposed in a common horizontal plane and an apertured plate 31 disposed in this plane. Supporting surfaces 30 and apertured plate 31 jointly form a horizontal fixture surface for the carrier substrate. A low-pressure device 32 is arranged underneath apertured plate 31. Furthermore, the device shown here includes five centering elements 10 through 13, each of which is rotationally and displaceably mounted on shafts 20 to 23, respectively, and fabricated from hardened high-grade steel.

Figure 2:
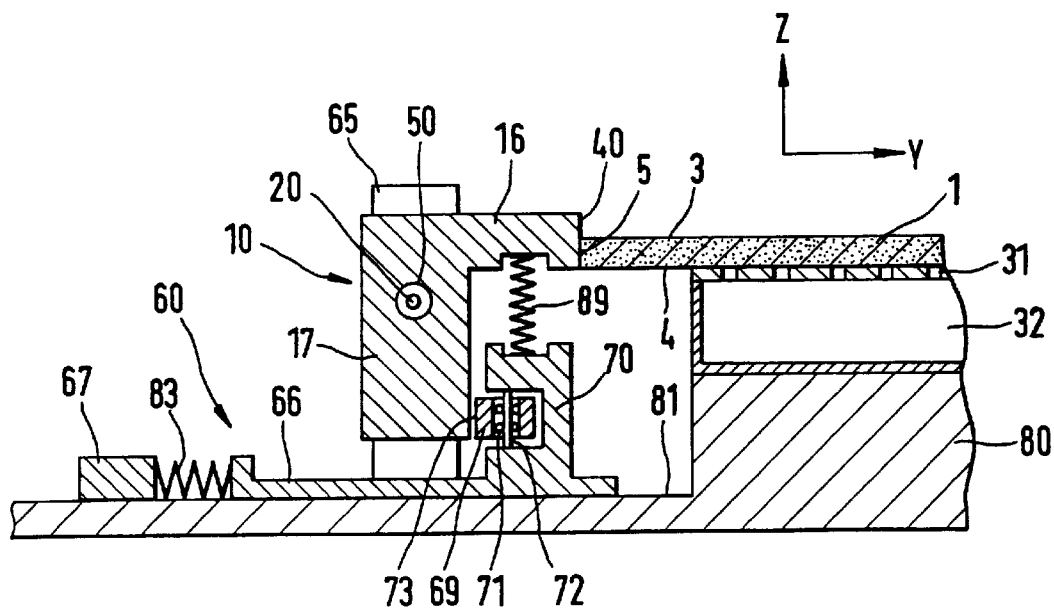
FIG. 2 shows a cross-section through an individual centering element and its adjusting device.
Figure 3:
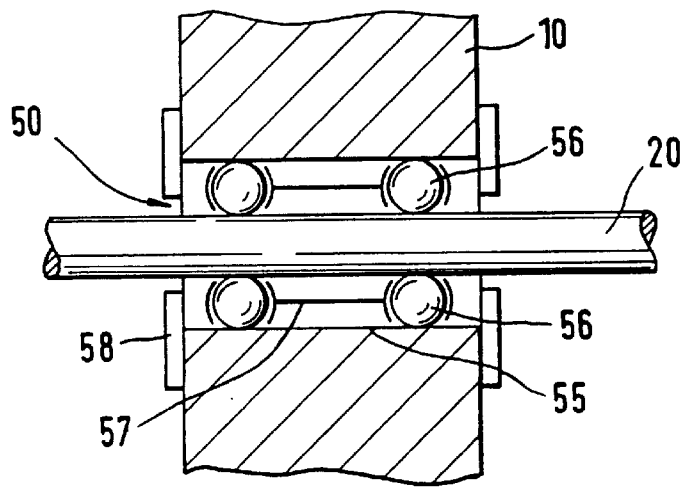
FIG. 3 shows a cross-section through a ball bearing of an individual centering element.

As shown in FIGS. 1 and 2, a centering element 10 is rotationally and, at the same time, displaceably mounted on a first shaft 20. The first shaft 20 is mounted on an adjusting device 60 in a direction parallel to the plane defined by horizontal fixture surface 30, 31 of the device. As is discernible in the exemplary embodiment shown in FIG. 2, first shaft 20 is arranged somewhat below the plane defined by horizontal fixture surface 30, 31. Centering element 10 supported on first shaft 20 has an L-shape, with a first leg 16 and a second leg 17 projecting perpendicularly therefrom. The end of first leg 16 facing away from second leg 17 is provided with a plane stop face 40 for engaging on the peripheral surface of carrier substrate 1. In the exemplary embodiment shown here, centering element 10 is rotationally and displaceably mounted on a shaft 20 by way of a ball bearing 50 which features cage-type guidance and is arranged in second leg 17. Ball bearing 50 is depicted in greater detail in FIG. 3. Ball bearing 50, known per se, has a ball bushing type of construction, such that balls 56 are arranged between shaft 20 and the inner wall of a cylindrical opening 55 which is arranged in centering element 10 parallel to shaft 20, the balls rolling directly off of shaft 20. Cage,guide 57 is used to guide balls 56 during a rotation or displacement of centering element 10 and to secure the position of balls 56 inside opening 55. A cover 58 prevents balls 56 from dropping out of the cylindrical opening 55. Using the described ball bearing 50 with the cage guidance ensures that centering element 10 is able to be displaced on shaft 20 and rotated about this shaft at the same time. It is also conceivable, however, to use a sliding bearing or a different bearing instead of ball bearing 50. It is important that centering element 10 be mounted both displaceably as well as rotationally on shaft 20.

As further shown in FIG. 1 and FIG. 2, the ends of first shaft 20 are fixed to two crosspieces 65, 66 of adjusting device 60, the crosspieces extending perpendicularly from seat-engaging fixture surface 30, 31. The two crosspieces 65, 66 are mounted on a sliding support 66 which can be moved by a motor having a drive unit along the direction referred to by y in FIG. 1 and FIG. 2. Unless otherwise specified in the following, the y-direction will be understood to include both the positive and the negative y-direction having a contrary sense. As best revealed by FIG. 2, sliding support 66 is arranged on a bar 81 in a manner allowing motion in the y-direction. Bar 81 is arranged on a stationary base part 80 of the device. Sliding support 66 is connected to a guide part 67 of adjusting device 60 via a spring element 83, the guide part being capable of moving in the y-direction. Furthermore, a stop element 69 is provided on sliding support 66 of adjusting device 60. Stop element 69 has the form of a cylindrical roller, which is mounted on a holding device 70 joined to sliding support 66 so as to permit rotation about a shaft 72 running substantially perpendicularly to fixture 30, 31. Roller 69 is rotationally mounted on shaft 72 by way of a ball bearing 71 having a cage guide. The outer lateral surface 73 of the cylindrical roller forms a stop face for centering element 10. In a position of the adjusting device, where centering element 10 does not yet contact carrier substrate 1, the second leg 17 juts downward more or less perpendicularly to fixture surface 30, 31, while first leg 16 is oriented more or less parallel to horizontal fixture surface 30, 31 and, with stop face 40, points toward the carrier substrate. In this position, leg 17 of centering element 10 engages on stop face 73 of stop element 69 as shown in FIG. 2. A spring element 89 braced against the upper side of holding device 70 and acting upon first leg 16, presses leg 17 against stop element 69 by a relatively weak spring tension to prevent centering element 10 from turning out of the original position shown in FIG. 2 when there is no engagement on carrier substrate 1.

To center a carrier substrate 1, a drive unit (not shown) moves guide part 67 to the right from the perspective of FIG. 2, whereby sliding support 66 is likewise shifted to the right via spring element 83. Sliding support 66 is shifted until centering element 10, via its plane stop face 40, engages on a section 5 of the peripheral surface of carrier substrate 1, in the position shown in FIG. 2. As soon as centering element 10 engages on the peripheral surface of the carrier substrate 1, a torque acts upon centering element 10, pressing the centering element counter-clockwise with leg 17, against stop element 69 in FIG. 2. In the process, stop element 69 prevents centering element 10 from rotating counter-clockwise on shaft 20. In response to a further movement of sliding support 66 to the right, carrier substrate 1 is shifted to the right on fixture surface 30, 31. As will be explained in more detail further below, centering elements 11 also engage on section 6 of the peripheral surface of carrier substrate 1 disposed opposite section 5, in the opposite direction (i.e., in the negative y-direction). Therefore, as soon as centering elements 11 engage on opposite section 6 of the peripheral surface of carrier substrate 1, spring element 83 is preloaded in FIG. 2 by a further adjusting movement of guide part 67 in the y-direction, until guide part 67 of adjusting device 60 reaches its end position predetermined by the drive unit. In the end position, centering element 10 is now pressed against the peripheral surface of carrier substrate 1 by the tensional force of spring element 83. When centering element 10 withdraws from the carrier substrate, the procedure is exactly the reverse. In FIG. 2, guide part 67 is moved to the left, causing sliding support 66, which is joined to guide part 67 via spring element 83, to likewise move to the left, and centering element 10 to move away from the carrier substrate. The exemplary embodiment of adjusting device 60 shown here is only one possibility of engaging centering element 10 on the carrier substrate with pretensioning of the spring. Other embodiments of the adjusting device are, of course, also conceivable. For example, spring element 83 can be a helical spring, a flat spring, an elastic rubber or any other spring element. Conceivable are also embodiments, in which shaft 20 of centering element 10 is not mounted on a sliding support, but on a feeding device of a different design. What is important is that centering element 10 is able to be adjusted toward and away from the carrier substrate in the y-direction. As shown in FIG. 1, provision is made for two further spring elements 68 designed as helical springs, which are slid onto shaft 20, and which are each braced with their first end against one of the two crosspieces 65, 66 and, with their second end, against centering element 10. As will be described further below, in response to a displacement on shaft 20 during alignment of carrier substrate 1, spring elements 68 are used to push centering element 10 back to its original position after carrier substrate 1 is removed from the device.

As FIG. 1 further reveals, in the exemplary embodiment shown here, two centering elements 11 having the same design as centering element 10, are arranged in a position opposite centering element 10 with respect to fixture 30, 31. Centering elements 11 are each rotationally and displaceably mounted on a first shaft 21 by way of ball bearings 51, in the same way as centering element 10. First shafts 21 are arranged parallel to first shaft 20 and parallel to the horizontal fixture surface 30, 31, at the level of shaft 20. This means first shafts 20 and 21 are arranged in a plane below and parallel to the plane defined by fixture surface 30, 31. However, it would also be conceivable to arrange the first shafts 20, 21 in the plane of the fixture surface. It is important that shafts 20, 21 be arranged in a way that does not allow torque to develop in response to engagement of centering elements 10, 11 on the carrier substrate, which would turn centering elements 10, 11 away from the stop elements. It is likewise possible for the two centering elements 11 to be mounted on merely one shaft 21. Shafts 21, in the same way as shaft 20, are mounted on a sliding support of an adjusting device 61, enabling them to likewise move toward and away from the fixture surface, in the y-direction. Adjusting device 61 has the same design as adjusting device 60, and is provided with roller-shaped stop elements for centering elements 11 and with spring elements which bring centering elements 11 into engagement with the stop elements. In contrast to adjusting device 60 shown in FIG. 2, in the case of adjusting device 61, it is possible to omit spring element 83, which presses centering element 11 against the peripheral surface of the carrier substrate. Since centering elements 10 and 11 engage on mutually opposing sections of the carrier substrate, the tensional force of spring element 83 of adjusting device 60 then presses both centering element 10 and centering elements 11 against the peripheral surface of the carrier substrate. Furthermore, centering elements 11, such as centering element 10, are displaceably mounted against the tensional force of spring elements (not shown in FIG. 1) arranged on shafts 21. In another exemplary embodiment, provision can be made for only one centering element 11, which is then located opposite centering element 10 relative to fixture 30, 31. It is also conceivable, of course, to mount two centering elements 10 on shaft 20, and two centering elements 11 on shaft 21. Other possible ways for mounting centering elements 10 and 11 are likewise conceivable.

As shown in FIG. 1, the device also includes two other centering elements 12, 13 which are each mounted displaceably on a second shaft 22, 23, rotationally about this shaft in the same manner as centering elements 10 and 11. The second shafts 22, 23 are arranged parallel to each other and run perpendicularly to fixture surface 30, 31. The other centering elements 12, 13 have the shape of a cylinder whose lateral surface is flattened on one side. The flattened sides of the cylinders form plane stop faces 42, 43 for engaging on the carrier substrate.

The other centering element 12 is rotationally and displaceably mounted on one of the second shafts, characterized by reference numeral 22 in FIG. 1, by way of a ball bearing 52 having cage-type guidance. In this case, shaft 22 and ball bearing 52 penetrate cylindrical centering element 12 in the axial direction. The second of the other centering elements, given reference numeral 13, is disposed opposite centering element 12 relative to fixture 30, 31, and has the same design. Centering element 13 is likewise rotationally and displaceably mounted on a shaft 23, which is parallel to shaft 22, by way of ball bearing 53 having a cage guide. The second shafts 22, 23 are each mounted on a further adjusting device 62, 63, so that centering elements 12, 13 can be moved in the x-direction toward and away from the fixture surface. In the same way as adjusting devices 60, 61, the other adjusting devices 62, 63 also include a sliding support which is linked via a spring element to a guide part of the adjusting devices driven by the drive unit. When centering elements 12, 13 engage on sections 7, 8 of the peripheral surface of carrier substrate 1, centering elements 11, 12 are pressed against the carrier substrate by the tensional force of the spring elements joined to the sliding supports. Here, it is also sufficient if one of the further adjusting devices 62, 63 is provided with a spring element, such as spring element 83 shown in FIG. 2.

Also provided are spring elements (not shown in FIG. 1), which, analogously to spring elements 89 and 68 acting upon centering elements 10 and 11, are loaded in response to a rotation or displacement of centering elements 12 and 13 out of their neutral position. In this context, the neutral position of the centering elements is considered to be position, in which no carrier substrate is located in fixture 30, 31. As a result, when the carrier substrate is removed from the fixture of the device, centering elements 12, 13 are moved back into a defined original position, and are ready for a new carrier substrate to be supplied. The spring elements can be secured, for example, to shafts 22 and 23 or the further adjusting devices 62, 63.

In the exemplary embodiment shown here, ceramic carrier substrates 1 have the form of rectangular thin boards having a first main surface 3 and, opposed thereto, a second main surface 4, and a peripheral surface which is formed by four narrow end, i.e., side faces 5, 6, 7, 8. However, the carrier substrates can have other forms, such as the form of a circular ceramic board, or the form of a rectangular board having a rectangular cutout, or other forms. As FIG. 1 further reveals, a carrier substrate 1 supplied to the screen-printing station, e.g., a brittle and fragile LTCC substrate (low temperature cofired ceramic) engages on supporting surfaces 30 and apertured plate 31 via its main surface 4 facing downward. Before carrier substrate 1 is supplied, centering elements 10, 11, 12 and 13 are removed from fixture surface 30, 31 in the y- and x-direction respectively by adjusting devices 60, 61, 62, 63 linked to a drive unit, so that carrier substrate 1 can be supplied without difficulty. In this context, carrier substrate 1 can be automatically brought to fixture surface 30, 31 via a conveyer belt or also be inserted manually. At this point, it is necessary for carrier substrate 1 resting on fixture surface 30, 31 to be aligned for the subsequent imprinting of the circuit traces. To this end, centering elements 10 through 13 are forced to engage on different sections of peripheral surface 5, 6, 7, 8 of the carrier substrate, following a predetermined order. In this context, the procedure is as follows. First, the two centering elements 11 are forced to engage on side face 6 of carrier substrate 1 via stop faces 41. For this, centering elements 11 are moved by adjusting device 61 in the negative y-direction toward the carrier substrate until they reach the predetermined end position. Centering element 13 is subsequently moved by adjusting device 63 in the x-direction toward the fixture surface and engages with its stop face 43 on side face 8 of the carrier substrate. In the process, centering,element 13 rotates in such a way that stop face 43 engages on side face 8 parallel to it. Centering element 10 is then first moved by adjusting device 60 toward the fixture surface until it engages with its stop face 40 on side face 5 of the carrier substrate disposed opposite side face 6. As explained further above, the carrier substrate is aligned in the y-direction by centering element 10. During centering in the y-direction, a rotary motion of carrier substrate 1 in the horizontal plane of fixture surface 30, 31 can occur. In this context, it is advantageous that, due to the fact that centering elements 10 and 11 are able to be displaced on or because they do slide along on first shafts 20, 21, side faces 5, 6 of carrier substrate 1, during a rotary motion of the same, are prevented from sliding along stop faces 40, 41 of the centering elements. Friction arising in the process could produce mechanical stress in carrier substrate 1.

Finally, centering element 12 engages on side face 7 of the carrier substrate and is pushed into its end position, thereby aligning carrier substrate 1 in the x-direction. In this context, it is a significant advantage that when the carrier substrate is aligned in the x-direction, centering elements 10, 11, already resting on the carrier substrate, are able to be displaced on first shafts 20, 21, along the x-direction. In this manner, one is able to avoid a relative movement and the resultant friction between stops 40, 41 of centering elements 10, 11 and side faces 5, 6 of the carrier substrate.

At this point, carrier substrate 1 is located in the desired position, as determined by the movement of centering elements 10 through 13 in the x-direction and in the y-direction. Centering elements 10 through 13 are pressed against the peripheral surface of the carrier substrate by the tensional force of the spring elements 83 integrated in adjusting devices 60 through 63, so that carrier substrate 1 is clamped in, between the centering elements. Now, negative pressure is applied to the bottom main surface 4 of the carrier substrate by low-pressure device 32 via apertured plate 31 to fix, or rather hold the carrier substrate in the aligned position. Since it may happen that carrier substrate 1, which is aligned in the x- and the y-direction, does not rest so as to be completely plane on fixture surface 30, 31, or is still somewhat inclined in the z-direction or is not completely even yet, carrier substrate 1 moves in the negative z-direction at some spots when the negative pressure is switched on, and consequently in a direction perpendicular to the horizontal fixture surface 30, 31. At this point, the further centering elements 12, 13 can advantageously move on the second shafts in the z-direction, so that a relative movement between stop faces 42, 44 and sections 7, 8 of the peripheral surface of the carrier substrate is avoided.

At the same time, centering elements 10 and 11 on first shafts 20, 21, can rotate about these shafts, thus allowing a compensation in the z-direction. This rotary motion will be explained based on the example of centering element 10 in FIG. 2. If section 5 of the peripheral surface of the carrier substrate moves in the negative z-direction, then centering element 10 in FIG. 2 rotates clockwise, leg 17 of centering element 10 being moved away from stop element 69 by the rotary motion. In the process, the centering element rotates against the tensional force of spring element 89. Therefore, the tensional force of spring element 89 is designed to be relatively low so that it hardly counteracts the rotary motion of centering element 10. In addition, during rotation of centering element 10 about shaft 20, leg 16 acts as a lever arm through which a force directed in the negative y-direction acts upon shaft 20. This force is transmitted by shaft 20 to sliding support 66, and is opposed to the tensional force of spring element 83. Therefore, given adequate suction capacity of low-pressure device 32, sliding support 66 of adjusting device 60 is pushed back in the negative y-direction, against the tensional force of spring element 83, against guide part 67. At the same time, centering element 10 rotates about shaft 20, stop face 40 of centering element 10 virtually rolling off of peripheral surface 5 of the carrier substrate until carrier substrate 1 engages evenly on fixture surface 30, 31. In the same manner, centering elements 11 rotate about shafts 21. In this manner, when the carrier substrate is suctioned, stops faces 40, 41 of centering elements 10 and 11 are also prevented from rubbing along the peripheral surface of the carrier substrates, so that damage to the brittle carrier substrates is avoided.

If, at this point, carrier substrate 1 is held fast by the negative pressure in fixture surface 30, 31, then centering elements 10, 11, 12, 13 can be removed from the peripheral surface of the carrier substrate. In the process, the weak spring elements 89 and 68 rotate and shift centering elements 10 and 11 back into their neutral position. When the centering elements are moved back, the relatively weak design of spring elements 89 and 68 prevents the centering elements from rubbing along the peripheral surface with high friction, which would damage the carrier substrate. In the same way, spring elements (not shown in FIG. 1) move back the other centering elements 12, 13 to their neutral position. After centering elements 10, 11, 12, 13 are removed, printed circuit traces can then be affixed to main surface 3 of carrier substrate 1 using the generally known screen-printing technique.

The device described here is by no means limited to use in screen-printing stations. It can also be used, for example, in an SMD inserter, it being possible for the centering elements, in this connection, to hold the carrier substrate during processing as well, so that low pressure device 32 can be omitted. When the placement head of an SMD inserter is lowered, the pressure applied to one of the main surfaces of the carrier substrate by the placement head can result in a relative movement of carrier substrate 1 in a direction perpendicular to the fixture surface. Here as well, the device according to the present invention also prevents the brittle carrier substrates from being damaged by any rubbing of the centering elements along the peripheral surface of the carrier substrate. Furthermore, other exemplary embodiments of the device according to the present invention are possible, where, for example, the other centering elements 12, 13 shown in FIG. 1 are not supported on two shafts running in a direction perpendicular to horizontal fixture 30, 31, but on two shafts running in the y-direction parallel to fixture 30, 31. In this case, centering elements 12, 13 can have the same design as centering elements 10, 11. Any breakage of carrier substrate 1 in response to a movement in the z-direction is then not avoided by a displacement of centering elements 12, 13 on shafts 22, 23, but by a rotation about these shafts. In this exemplary embodiment, the other centering elements 12, 13 can then be designed, for example, analogously to centering elements 10, 11.

What is claimed is:

1. A device for aligning a carrier substrate for an electronic circuit, the carrier substrate including a first main surface and a second main surface disposed in parallel to each other and a plurality of peripheral surfaces, the device comprising:

a horizontal fixture, the first main surface facing upward to the horizontal fixture;

a plurality of adjusting devices;

a plurality of shafts; and a plurality of centering elements for aligning the carrier substrate in the horizontal fixture by being able to be forced to engage on the plurality of peripheral surfaces of the carrier substrate by using a respective one of the plurality of adjustment devices in accordance with a spring tension, wherein:

the plurality of centering elements shift the carrier substrate in the horizontal fixture into a predetermined position, at least two of the plurality of centering elements are each respectively mounted rotationally and displaceably in an axial direction on a respective one of the plurality of shafts, each one of the shafts associated with the at least two of the plurality of centering elements is oriented in parallel with each another and in parallel with the horizontal fixture, each one of the shafts associated with the at least two of the plurality of centering elements is adjustable by a respective one of the plurality of adjusting devices along a first direction relative to the carrier substrate, the at least two of the plurality of centering elements are each able to be forced to engage on a respective one of the plurality of peripheral surfaces by using the spring tension acting in the first direction, each respective one of the plurality of peripheral surfaces being disposed opposite one another in the first direction, at least two further centering elements of the plurality of centering elements are each able to be moved relative to the carrier substrate by a further respective one of the plurality of adjusting devices along a second direction running perpendicular to the first direction, the at least two further centering elements are each able to be forced to engage with stop faces by using the spring tension acting in the second direction at a further respective one of the plurality of peripheral surfaces, each further respective one of the plurality of peripheral surfaces being disposed opposite one another in the second direction, and the stop faces are movably supported in a direction perpendicular to the horizontal fixture.

2. The device according to claim 1, wherein:

the at least two further centering elements are mounted rotationally and displaceably in the axial direction on at least two further shafts of the plurality of shafts running in parallel with one another and perpendicularly to the horizontal fixture.

3. The device according to claim 1, further comprising:

at least one stop element having a stop face, wherein:

each one of the plurality of shafts associated with the at least two of the plurality of centering elements is mounted on the respective one of the plurality of adjusting devices in a plane below a plane defined by the horizontal fixture, each one of the at least one stop element is arranged on an associated one of the plurality of adjusting devices, and the engagement of each one of the at least two of the plurality of centering elements supported on each respective one of the plurality of shafts on the respective one of the plurality of peripheral surfaces and a resultant torque press the at least two of the plurality of centering elements against the stop face of a respective one of the at least one the stop element.

4. The device according to claim 3, wherein:

the stop face of the at least one stop element is movably supported in the second direction.

5. The according to claim 4, further comprising an additional shaft running perpendicularly with respect to the horizontal fixture, wherein:

each one of the at least one stop element includes a cylindrical roller mounted at the respective one of the plurality of adjusting devices in order to allow a rotation about the additional shaft, and the stop face of each one of the at least one stop element is formed by a lateral surface of the associated cylindrical roller.

6. The device according to claim 1, further comprising:

a spring element, wherein:

at least one of the plurality of centering elements is mounted on an associated one of the plurality of shafts in a manner such that a displacement against a tensional force of the spring element is allowed.

7. The device according to claim 1, further comprising:

a spring element, wherein:

a rotary motion of at least one of the plurality of centering elements about an associated one of the plurality of shafts is counteracted by a tensional force of the spring element.

8. The device according to claim 1, wherein:
at least one of the plurality of centering elements includes a plane stop face for engaging an associated one of the plurality of peripheral surfaces.

9. The device according to claim 1, further comprising:
a ball bearing, wherein:
at least one of the plurality of centering elements is rotationally and displaceably mounted on an associated one of the plurality of shafts by the ball bearing.

10. A method for aligning a carrier substrate in accordance with an operation of a device including:
a horizontal fixture, the first main surface facing upward to the horizontal fixture;
a plurality of adjusting devices;
a plurality of shafts; and
a plurality of centering elements for aligning the carrier substrate in the horizontal fixture by being able to be forced to engage on the plurality of peripheral surfaces of the carrier substrate by using a respective one of the plurality of adjustment devices in accordance with a spring tension, wherein:
the plurality of centering elements shift the carrier substrate in the horizontal fixture into a predetermined position,
at least two of the plurality of centering elements are each respectively mounted rotationally and displaceably in an axial direction on a respective one of the plurality of shafts,
each one of the shafts associated with the at least two of the plurality of centering elements is oriented in parallel with each another and in parallel with the horizontal fixture,
each one of the shafts associated with the at least two of the plurality of centering elements is adjustable by a respective one of the plurality of adjusting devices along a first direction relative to the carrier substrate,
the at least two of the plurality of centering elements are each able to be forced to engage on a respective one of the plurality of peripheral surfaces, each respective one of the plurality of peripheral surfaces being disposed opposite one another in the first direction by using the spring tension acting in the first direction,
at least two further centering elements of the plurality of centering elements are each able to be moved relative to the carrier substrate by a further respective one of the plurality of adjusting devices along a second direction running perpendicular to the first direction,
the at least two further centering elements are each able to be forced to engage with stop faces using the spring tension acting in the second direction at a further respective one of the plurality of peripheral surfaces, each further respective one of the plurality of peripheral surfaces being disposed opposite one another in the second direction, and
the stop faces are movably supported in a direction perpendicular to the horizontal fixture, the method comprising the step of:
forcing each one of the plurality of centering elements to engage successively on an associated one of the plurality of peripheral surfaces of the carrier substrate such that one of the at least two further centering elements of the plurality of centering elements is the last to engage the associated one of the plurality of peripheral surfaces.

\* \* \* \* \*